(12) United States Patent
Huang

(10) Patent No.: US 10,013,899 B2
(45) Date of Patent: Jul. 3, 2018

(54) LED DISPLAY MODULE AND ITS PRODUCE METHOD

(71) Applicant: Shenzhen Gem Led Photoelectric Technology. Ltd, Shenzhen (CN)

(72) Inventor: Fuqiang Huang, Shenzhen (CN)

( * ) Notice: Subject to any disclaimer, the term of this patent is extended or adjusted under 35 U.S.C. 154(b) by 0 days.

(21) Appl. No.: 15/632,322

(22) Filed: Jun. 24, 2017

(65) Prior Publication Data

US 2017/0316721 A1     Nov. 2, 2017

Related U.S. Application Data

(63) Continuation of application No. PCT/CN2015/098648, filed on Dec. 24, 2015.

(30) Foreign Application Priority Data

Dec. 24, 2014   (CN) .......................... 2014 1 0814161

(51) Int. Cl.
| | |
|---|---|
| *H05B 37/00* | (2006.01) |
| *G09F 9/33* | (2006.01) |
| *H05K 3/32* | (2006.01) |
| *H05K 3/30* | (2006.01) |

(52) U.S. Cl.
CPC .............. *G09F 9/33* (2013.01); *H05K 3/301* (2013.01); *H05K 3/32* (2013.01); *H05K 2201/10106* (2013.01)

(58) Field of Classification Search
CPC . G09F 9/33; H05K 3/301; H05K 3/32; H05K 2201/10106
USPC ......................................................... 315/312
See application file for complete search history.

(56) References Cited

U.S. PATENT DOCUMENTS

| | | | | |
|---|---|---|---|---|
| 2009/0185393 A1* | 7/2009 | Kang | .................. | G02B 6/0073 362/612 |
| 2017/0192147 A1* | 7/2017 | Ha | ......................... | G02B 6/009 |

FOREIGN PATENT DOCUMENTS

| | | |
|---|---|---|
| CN | 200959195 Y | 10/2007 |
| CN | 101097669 A | 1/2008 |
| CN | 201584123 U | 9/2010 |
| CN | 103700325 A | 4/2014 |
| CN | 104537959 A | 4/2015 |
| CN | 104537960 A | 4/2015 |
| CN | 204303282 U | 4/2015 |
| CN | 204303283 U | 4/2015 |
| CN | 204303285 U | 4/2015 |
| CN | 204375356 U | 6/2015 |

(Continued)

*Primary Examiner* — Daniel D Chang
(74) *Attorney, Agent, or Firm* — Wayne & King LLC

(57) ABSTRACT

Disclosed are an LED (Light Emitting Diode) display module and a method of fabricating the LED display module. Lamp beads in the LED display module are fixed to the surface of a linearly arranged lamp bead plate, the lamp bead plate is fixed to a driving PCB (Printed Circuit Board), the surface of the lamp bead plate is perpendicular to the surface of the driving PCB, the surface of the driving PCB is perpendicular to the surface of a glass plate, and a fixed member is fixed on a frame. The transparent glass plate with high transparency is employed as a mounting body and the driving PCB is transversely disposed on the glass plate, so that shielding of light by the driving PCB can be remarkably reduced and the transparency of the LED display module is improved.

10 Claims, 12 Drawing Sheets

(56) References Cited

FOREIGN PATENT DOCUMENTS

DE 202009000493 U1 3/2009

* cited by examiner

LED DISPLAY MODULE AND ITS PRODUCE METHOD

CROSS-REFERENCE TO RELATED APPLICATIONS

This application is a continuation of International Patent Application No. PCT/CN2015/098648 with a filing date of Dec. 24, 2015, designating the United States, now pending, and further claims priority to Chinese Patent Application 201410814161.4 with a filing date of Dec. 24, 2014. The content of the aforementioned application, including any intervening amendments thereto, are incorporated herein by reference.

TECHNICAL FIELD

The present invention relates to the display field of LEDs, and particularly relates to an LED display module and a preparation method thereof.

BACKGROUND OF THE PRESENT INVENTION

Due to the characteristics of flexible size and strong environmental adaptability, an LED display screen is widely applied in the field of media. At present, LED display devices universally used in a market are generally of black box body type, lamp bar screen and grid screen type structures and strip structure. In some special occasions, environments such as glass curtain walls, shopwindows, stage backgrounds, emporiums, hotels, airports and the like need an LED display module to be high in permeability and good in daylighting and light transmission effects and also keep certain pixel density at the same time; while the LED display devices of the black box body type, lamp bar screen and grid screen type structures cannot be coordinated with peripheral using environments. For example, if the box body type LED display devices are installed on the glass curtain walls and background walls, light may be completely blocked, and the light transmittance effect is lost; lamp bar screens and grid screens are difficult to satisfy glass curtain wall structures of various sizes; if the using cost is greatly increased, it is very inconvenient for later maintenance; and the strip LED display screens are formed as follows: LED light-emitting units are installed on strip circuit boards and fixed by a non-transparent housing, a plurality of such lamp bars form a unit module, and a plurality of unit modules are cascaded to form a display screen. Because the non-transparent housing occupies a larger space, certain light transmittance effect may be provided only when a pixel pitch between two unit modules is above 40 mm, but the display screen is not suitable for an application occasion with a smaller watching distance if the pixel pitch is too large. Meanwhile, because it is apparent that the strip structure of such non-transparent display module may bring people a bounding feeling whether installed indoors or outdoors and is not suitable for high-grade application occasions such as the shopwindows, emporium glass curtain walls and the like, the market calls for the LED display screen with high pixel density and high permeability.

SUMMARY OF PRESENT INVENTION

The present invention aims to overcome defects of the above existing similar product structure to provide an LED display module and a preparation method thereof, and is intended to provide an LED display module with high pixel density and high permeability.

Technical Solution

The present invention is realized as follows: on one hand, an LED display module is provided, comprising a plurality of lamp beads, linearly arranged lamp bead boards, linearly arranged driving PCBs, a frame, a transparent glass board, connecting boards and a fixing piece. The plurality of lamp beads are fixed to board surfaces of the lamp bead boards. The lamp bead boards are fixed to the driving PCBs. The board surfaces of the lamp bead boards are perpendicular to the board surfaces of the driving PCBs. The driving PCBs are fixed to the connecting boards. Each connecting board comprises a first sub-connecting board and a second sub-connecting board arranged on both ends of one side of the driving PCBs. The frame is fixed to the glass board. The board surfaces of the driving PCBs are perpendicular to the board surface of the glass board. The fixing piece is fixed to the frame. The frame comprises a first sub-frame positioned on the top of the driving PCBs, and a second sub-frame positioned on the bottom of the driving PCBs. The first sub-frame and the second sub-frame are L-shaped. The first sub-frame comprises a first surface and a second surface. The first surface is arranged on the top of the driving PCBs, and the second surface is arranged on the board surfaces of the driving PCBs. The second sub-frame comprises a third surface and a fourth surface. The third surface is arranged on the bottom of the driving PCBs, and the fourth surface is arranged on the board surfaces of the driving PCBs.

Further, the plurality of lamp beads are arranged on the board surfaces of the lamp bead boards at an equal distance.

Further, an axial direction of a light emitting plane of the lamp beads is perpendicular to a plane direction of the transparent glass board.

Further, connecting needle seats are respectively arranged on both ends of the driving PCBs; the driving PCBs are fixedly connected with the first sub-connecting board and the second sub-connecting board through the connecting needle seats; and the board surfaces of the driving PCBs are perpendicular to the board surface of the first sub-connecting board and the board surface of the second sub-connecting board.

On the other hand, a preparation method of the LED display module is provided, comprising the following steps:

(1) automatically pasting a plurality of lamp beads on the board surfaces of the lamp bead boards;

(2) automatically pasting a driving IC encapsulated by a QFN technology on the driving PCBs;

(3) flatly fixing the lamp bead boards in a special pallet with every 8 tamp bead boards as a group; and after coating tin glue on back surfaces of 8 lamp bead boards, vertically placing 8 driving PCBs into a pallet positioning frame and fixedly putting into an automatic reflow soldering device through a pallet fixture for processing with a furnace;

(4) welding pin headers of the lamp bead boards on the driving PCBs through pallet fixation by adopting a semi-automatic spot welder device;

(5) connecting and welding the welded lamp bead boards and the driving PCBs left and right through a fixture to realize 32 left or right lamp bar driving PCBs;

(6) fixedly welding connection pin headers of the 32 left or right lamp bar driving PCBs by adopting a semi-automatic spot welder device, and arranging one connecting board respectively on left and right to complete an old test of a left and a right module PCBA semi-finished products;

(7) assembling the transparent glass board and the frame to complete a pallet rack;

(8) assembling the left and the right module PCBA semi-finished products into the pallet rack to complete a double-rod structural module; and (9) fixing the fixing piece to the frame to obtain the LED display module.

Specifically, the thickness of the lamp bead boards and the driving PCBs is 0.5-1.5 mm, and the length of the lamp bead boards and the driving PCBs is 315-325 mm.

Specifically, the thickness of the connecting boards is 1.5-2.5 mm, and the height of the connecting boards is 155-165 mm. [0012] Specifically, the fixing piece and the frame are made of aluminum alloy, and the lamp bead boards, the driving PCBs and the connecting boards are made of glass fibers.

Specifically, the glass board is a high-transparency homogeneous substrate made of PMMA polymer material.

Beneficial Effects

The present invention has the beneficial effects that: the high-transparency transparent glass board is adopted as a mounting body in the present invention, and the driving PCBs are transversely arranged on the transparent glass board, so that blocking to the light by the driving PCBs may be greatly reduced, and the transparency of the LED display module is improved; and meanwhile, by fixing a plurality of lamp beads on the board surfaces of the linearly arranged lamp bead boards, the pixel density of the LED display module is improved.

DETAILED DESCRIPTION OF PREFERRED EMBODIMENTS

Figure 1:
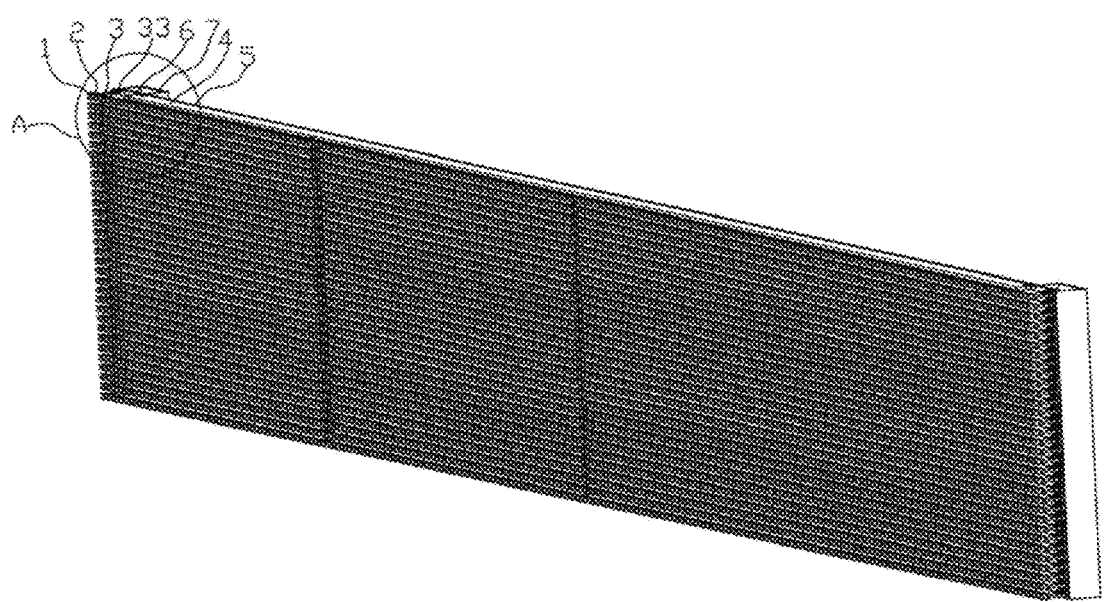
FIG. 1 is a stereoscopic schematic diagram of an LED display module provided by an embodiment of the present invention.

Technical schemes in the embodiments of the invention will be described clearly and completely in combination with the accompanying drawings in the embodiments of the invention below.

As shown in FIG. 1 to FIG. 12, embodiments of the present invention provide an LED display module, comprising a plurality of lamp beads 1, linearly arranged lamp bead boards 2, linearly arranged driving PCBs 3, a frame 4, a transparent glass board 5, connecting boards 6 and a fixing piece 7. The plurality of lamp beads 1 are fixed to board surfaces of the lamp bead boards 2. The lamp bead boards 2 are fixed to the driving PCBs 3. The board surfaces of the lamp bead boards 2 are perpendicular to the board surfaces of the driving PCBs 3. The driving PCBs 3 are fixed to the connecting boards 6. Each connecting board 6 comprises a first sub-connecting board 61 and a second sub-connecting board 62 arranged on both ends of one side of the driving PCBs 3. The frame 4 is fixed to the glass board 5. The board surfaces of the driving PCBs 3 are perpendicular to the board surface of the glass board 5. The fixing piece 7 is fixed to the frame 4.

Preferably, the plurality of lamp beads 1 are arranged on the board surfaces of the lamp bead boards 2 at an equal distance. The plurality of lamp beads 1 are arranged on the board surfaces of the lamp bead boards 2 to ensure the pixel density of the LED display module. Preferably, 3528 lamp beads 1 are arranged, and 3528 lamp beads 1 are pasted on the board surfaces of the lamp bead boards 2 through an automatic pasting mode.

Preferably, the fixing piece 7 comprises a first sub-fixing piece 71 and a second sub-fixing piece 72 which are arranged at two ends of one side of the frame 4 and are both in a U-like shape. The first sub-fixing piece 71 comprises a first bottom board 711, a first side board 712, a second side board 713 and a first transverse board 714. The bottoms of the first side board 712 and the second side board 713 are connected with the two opposite sides of the first bottom board 711 respectively. The first transverse board 714 is arranged on one side of the top of the second side board 713 and extends outward. The first bottom board 711, the first side board 712 and the second side board 713 form a space used for accommodating the first sub-connecting board 61. The second sub-fixing piece 72 comprises a second bottom board 721, a third side board 722, a fourth side board 723 and a second transverse board 724. The bottoms of the third side board 722 and the fourth side board 723 are connected with the two opposite sides of the second bottom board 721 respectively. The second transverse board 724 is arranged on one side of the top of the third side board 722 and extends outward. The second bottom board 721, the third side board 722 and the fourth side board 723 form a space used for accommodating the second sub-connecting board 62.

Preferably, a first fixing block 31 is arranged on the board surfaces of the driving PCBs 3, and a second fixing block 32 is arranged on one side of the driving PCBs 3 close to the frame 4. Through arrangement of the first fixing block 31 and the second fixing block 32, the firmness of the driving PCBs 3 may be further improved. Because made of the PMMA polymer material, the first fixing block 31 and the second fixing block 32 have high transparency. In this way, the first fixing block 31 and the second fixing block 32 have the function of fixing the driving PCBs 3 without influencing the transmittance of the LED display module.

Preferably, the frame 4 comprises a first sub-frame 41 positioned on the top of the driving PCBs 3, and a second sub-frame 42 positioned on the bottom of the driving PCBs 3. The first sub-frame 41 and the second sub-frame 42 are L-shaped. The first sub-frame 41 comprises a first surface 411 and a second surface 412. The first surface 411 is arranged on the top of the driving PCBs 3, and the second surface 412 is arranged on the board surfaces of the driving PCBs 3. The second sub-frame 42 comprises a third surface 421 and a fourth surface 422. The third surface 421 is arranged on the bottom of the driving PCBs 3, and the fourth surface 422 is arranged on the board surfaces of the driving PCBs 3.

Preferably, a plurality of light transmission holes 43 distributed at intervals are formed in the second surface 412 and the third surface 421 respectively. With arrangement of the light transmission holes 43, the weight of the LED display module may be lightened, and the transparency of the LED display module may also be improved. Preferably, the first fixing block 31 is arranged on the board surfaces of the driving PCBs 3, and the second fixing block 32 is arranged on one side of the driving PCBs 3 close to the frame 4, and extends out of the edge of the driving PCBs 3. Through arrangement of the first fixing block 31 and the second fixing block 32, the firmness of the driving PCBs 3 may be improved. In addition, as made of the PMMA polymer material, the first fixing block 31 and the second fixing block 32 have high transparency. In this way, the first fixing block 31 and the second fixing block 32 have the function of fixing the driving PCBs 3 without influencing the transmittance of the LED display module.

Preferably, the width of the cross section of the lamp beads 1 is equivalent to that of the board surfaces of the lamp bead boards 2. Because the width of the cross section of the lamp beads 1 is equivalent to that of the board surfaces of the lamp bead boards 2, blocking to the light by the lamp beads 1 may be avoided, and the transparency of the LED display module is guaranteed.

Preferably, the axial direction of the light emitting plane of the lamp beads 1 is perpendicular to the plane direction of the transparent glass board 5, so that the luminous brightness of the LED display module may be improved, and the occupying space of a driving circuit is effectively saved.

Preferably, connecting needle seats 33 are respectively arranged on both ends of the driving PCBs 3; the driving PCBs 3 are fixedly connected with the first sub-connecting board 61 and the second sub-connecting board 62 through the connecting needle seats 33; and the board surfaces of the driving PCBs 3 are perpendicular to the board surface of the first sub-connecting board 61 and the board surface of the second sub-connecting board 62.

According to the LED display module provided by the present invention, the high-transparency transparent glass board 5 is adopted as the mounting body, the lamp beads 1 are fixed on the board surfaces of the lamp bead boards 2, the lamp bead boards 2 are fixed on the driving PCBs 3, the board surfaces of the lamp bead boards 2 are perpendicular to the board surfaces of the driving PCBs 3, the driving PCBs 3 are fixed on the connecting board 6, and the board surfaces of the driving PCBs 3 are perpendicular to the board surface of the glass board 5. In this way, by transversely arranging the driving PCBs 3 on the glass board 5, blocking to the light by the driving PCBs 3 may be greatly reduced, and the transparency of the LED display module is improved; and meanwhile, by fixing a plurality of lamp beads 1 on the board surfaces of the linearly arranged lamp bead boards 2, the pixel density of the LED display module is improved.

Figure 13:
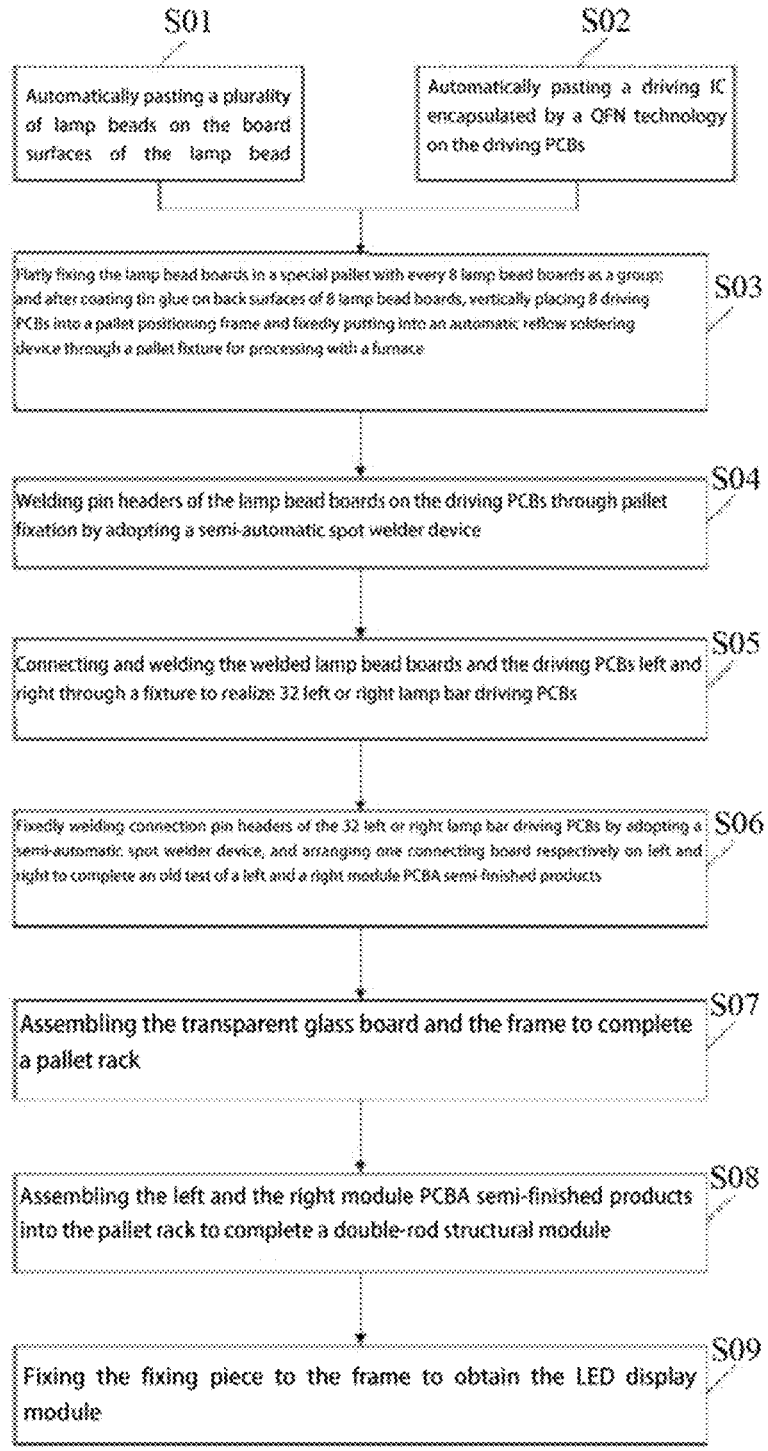
FIG. 13 is a flow chart of a preparation method of an LED display module provided by an embodiment of the present invention.

Accordingly, embodiments of the present invention provide a preparation method of an LED display module. A flow chart of the preparation method is shown in FIG. 13. The method comprises the following steps:

S01. automatically pasting a plurality of lamp beads on the board surfaces of the lamp bead boards;

S02. automatically pasting a driving IC encapsulated by a QFN (Quad Flat No-lead Package) technology on the driving PCBs;

S03. flatly fixing the lamp bead boards in a special pallet with every 8 lamp bead boards as a group; and after coating tin glue on back surfaces of 8 lamp bead boards, vertically placing 8 driving PCBs into a pallet positioning frame and fixedly putting into an automatic reflow soldering device through a pallet fixture for processing with a furnace;

S04. welding pin headers of the lamp bead boards on the driving PCBs through pallet fixation by adopting a semi-automatic spot welder device;

S05. connecting and welding the welded lamp bead boards and the driving PCBs left and right through a fixture to realize 32 left or right lamp bar driving PCBs;

S06. fixedly welding connection pin headers of the 32 left or right lamp bar driving PCBs by adopting a semi-automatic spot welder device, and arranging one connecting board respectively on left and right to complete an old test of a left and a right module PCBA semi-finished products;

S07. assembling the transparent glass board and the frame to complete a pallet rack;

S08. assembling the left and the right module PCBA semi-finished products into the pallet rack to complete a double-rod structural module; and S09. fixing the fixing piece to the frame to obtain the LED display module.

Specifically, the thickness of the lamp bead boards and the driving PCBs is 0.5-1.5 mm, and the length of the lamp bead boards and the driving PCBs is 315-325 mm. The thickness of the lamp bead boards and the driving PCBs is preferably 1 mm, and the length of the lamp bead boards and the driving PCBs is preferably 320 mm.

Specifically, the thickness of the connecting boards is 1.5-2.5 mm, the height of the connecting boards is 155-165 mm, the thickness of the connecting boards is preferably 2 mm, and the height of the connecting boards is preferably 160 mm.

Preferably, the fixing piece and the frame are made of aluminum alloy.

Preferably, the lamp bead boards, the driving PCBs and the connecting boards are made of glass fibers. The glass fibers have the advantages of light weight, high strength and the like. Therefore, the lamp bead boards, the driving PCBs and the connecting boards have the advantages of light weight, high strength and the like.

Preferably, the glass board is a high-transparency homogeneous substrate made of the PMMA polymer material and has the characteristics of beauty, high transparency and easiness in machining, and the transparency of the LED display module is improved by taking the glass board as a substrate of the LED module.

The present invention is described below in detail in combination with specific examples.

Embodiment 1

Figure 2:
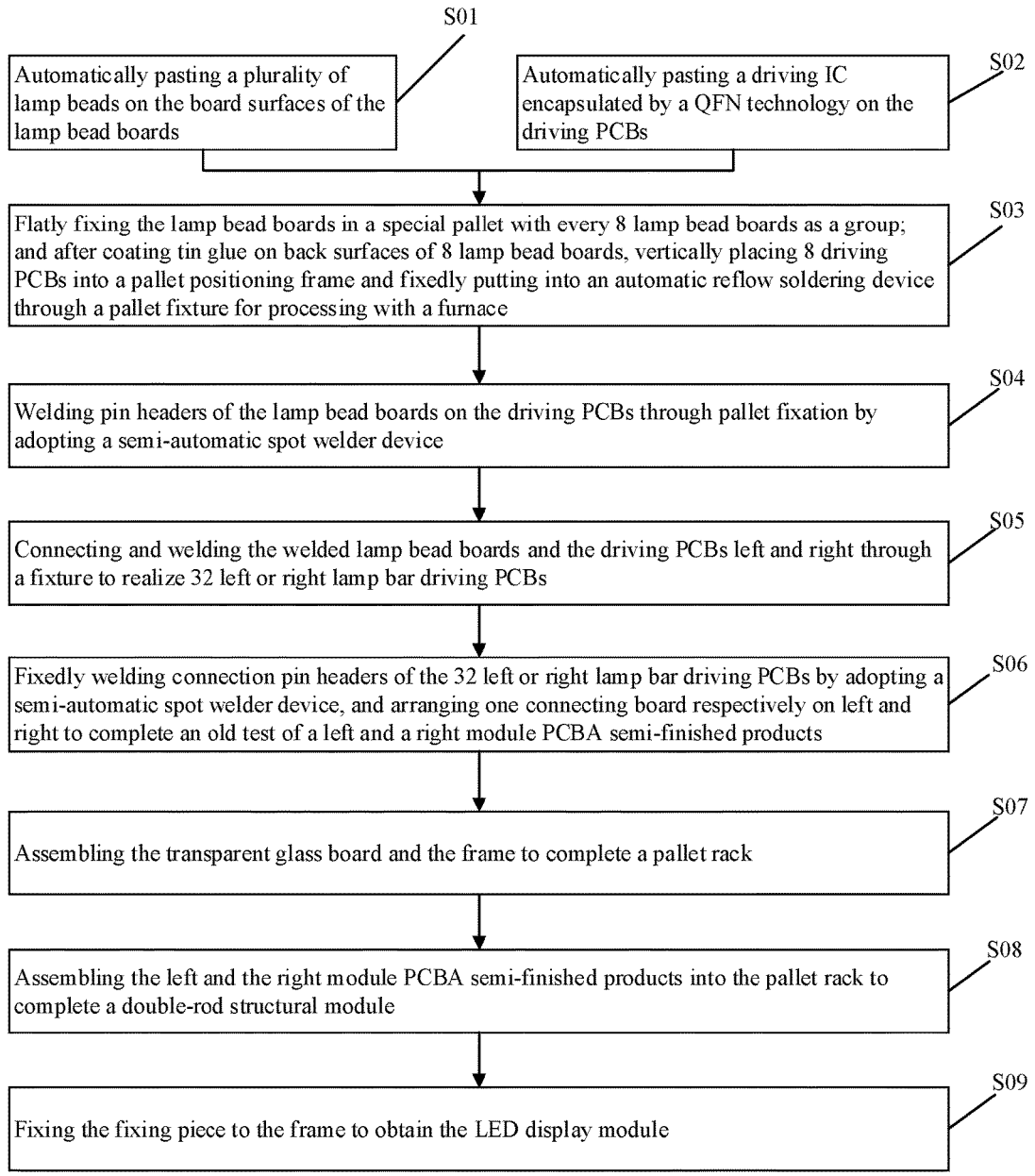
FIG. 2 is an enlarged schematic diagram of A part in FIG. 1.
Figure 3:
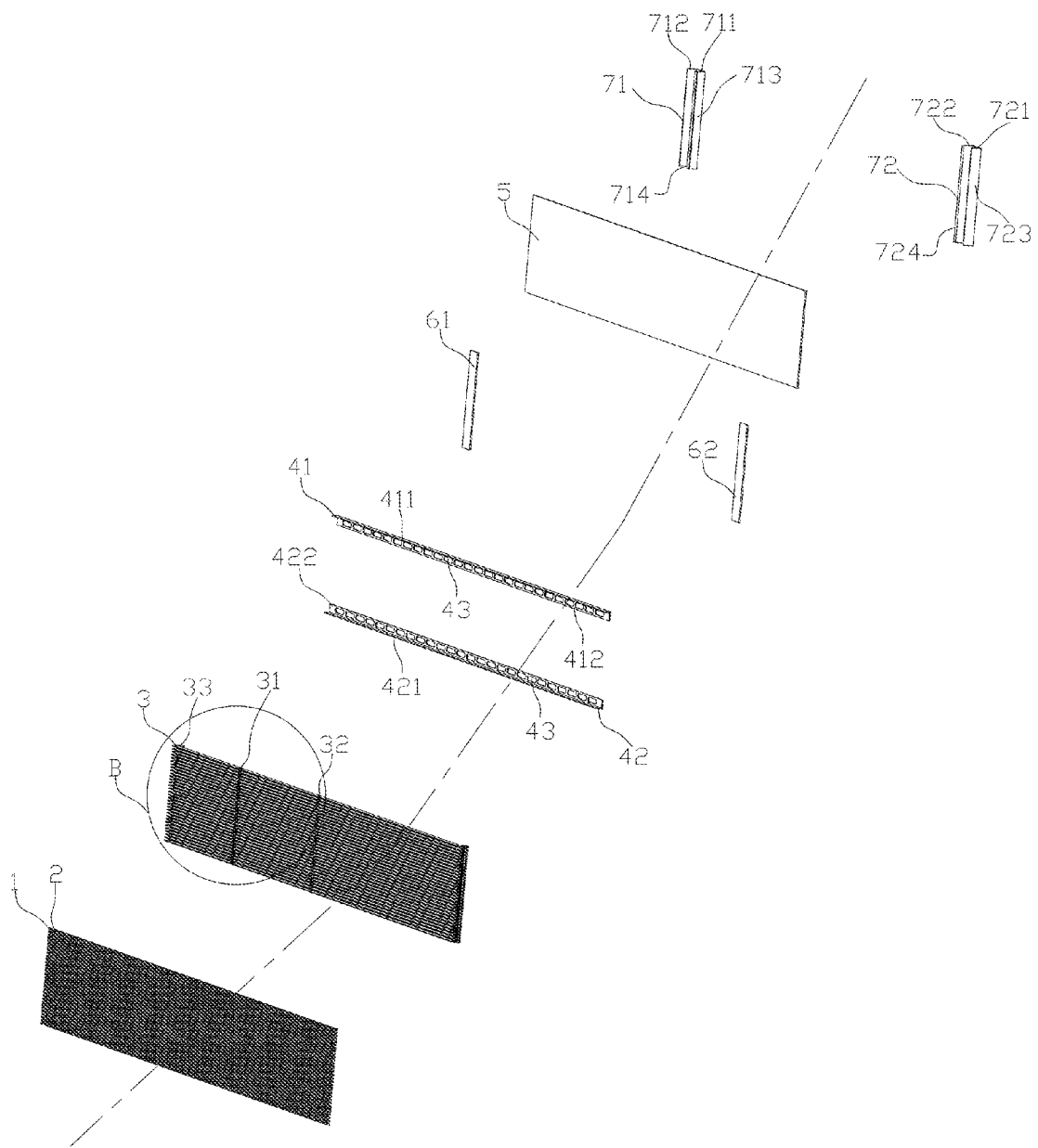
FIG. 3 is an exploded schematic diagram of an LED display module provided by an embodiment of the present invention.
Figure 4:
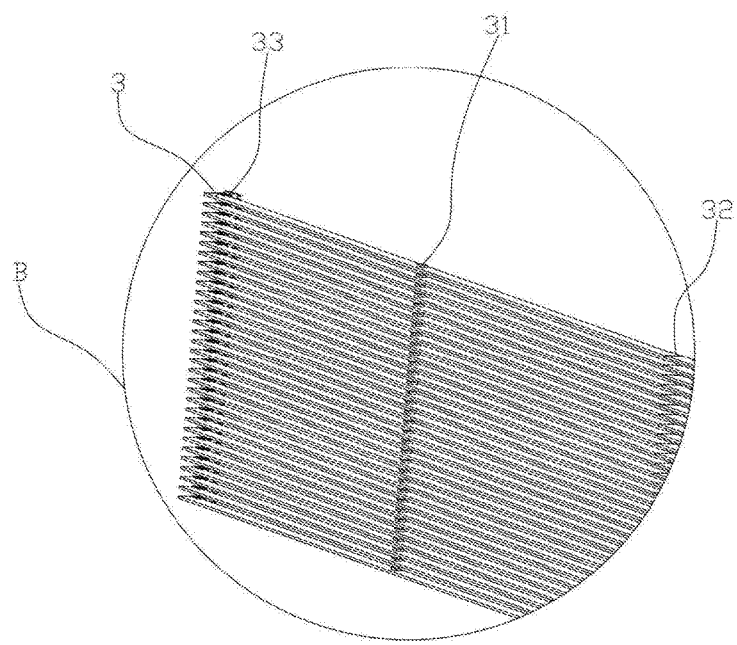
FIG. 4 is an enlarged schematic diagram of B part in FIG. 3.
Figure 5:
FIG. 5 is a front view of an LED display module provided by an embodiment of the present invention.
Figure 6:
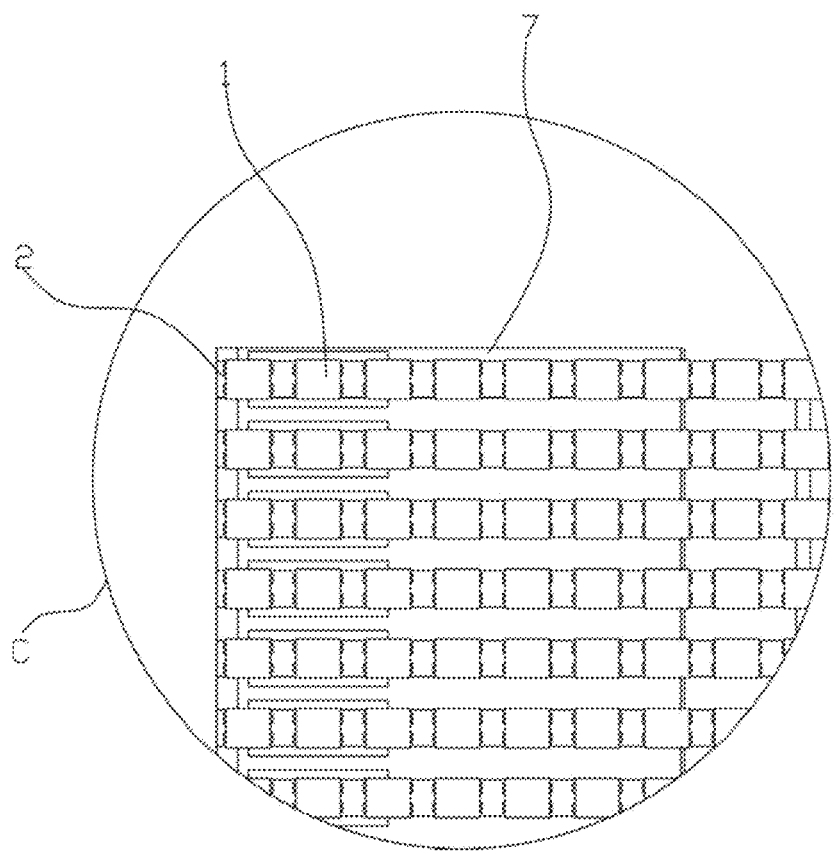
FIG. 6 is an enlarged schematic diagram of C part in FIG. 5.
Figure 7:
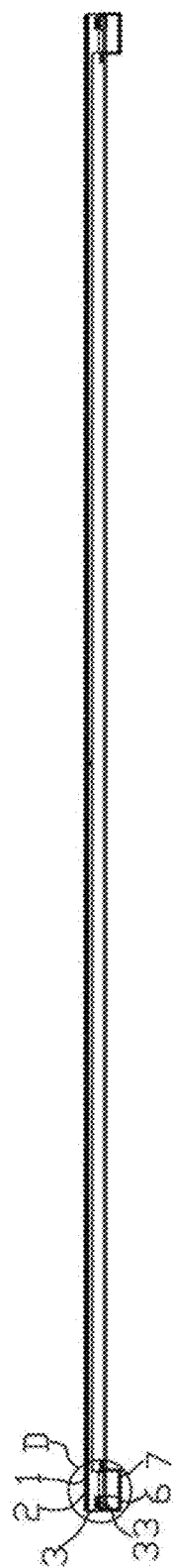
FIG. 7 is a top view of an LED display module provided by the present invention.
Figure 8:
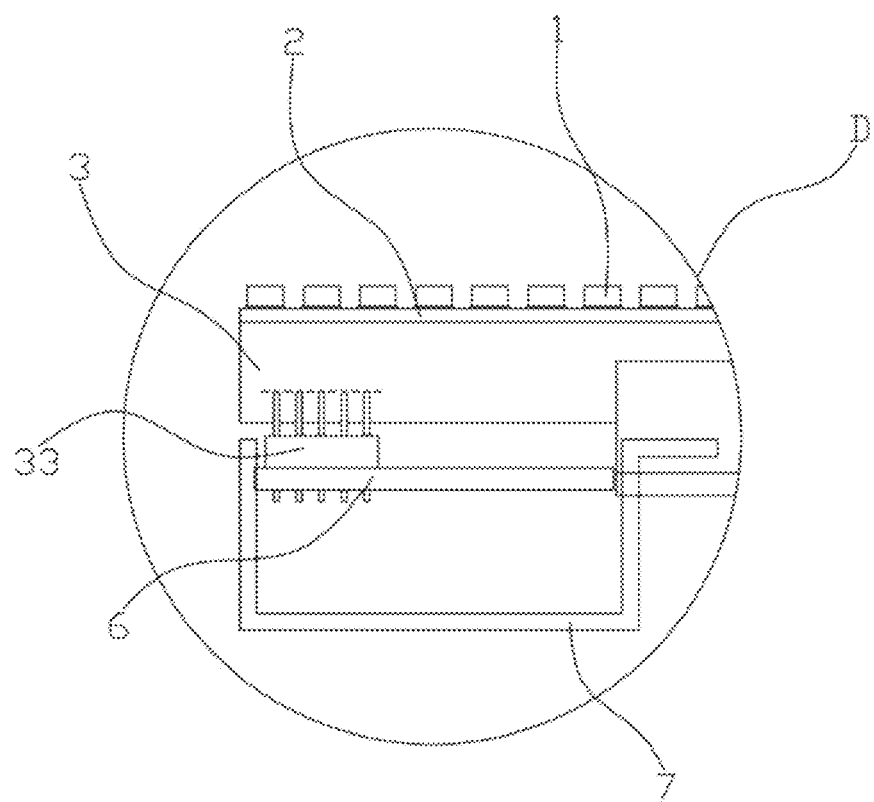
FIG. 8 is an enlarged schematic diagram of D part in FIG. 7.
Figure 9:
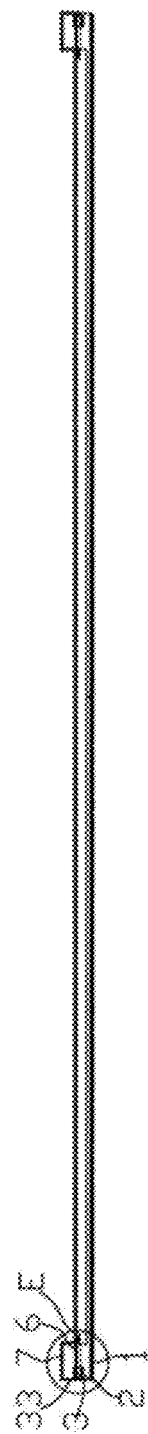
FIG. 9 is a bottom view of an LED display module provided by the present invention.
Figure 10:
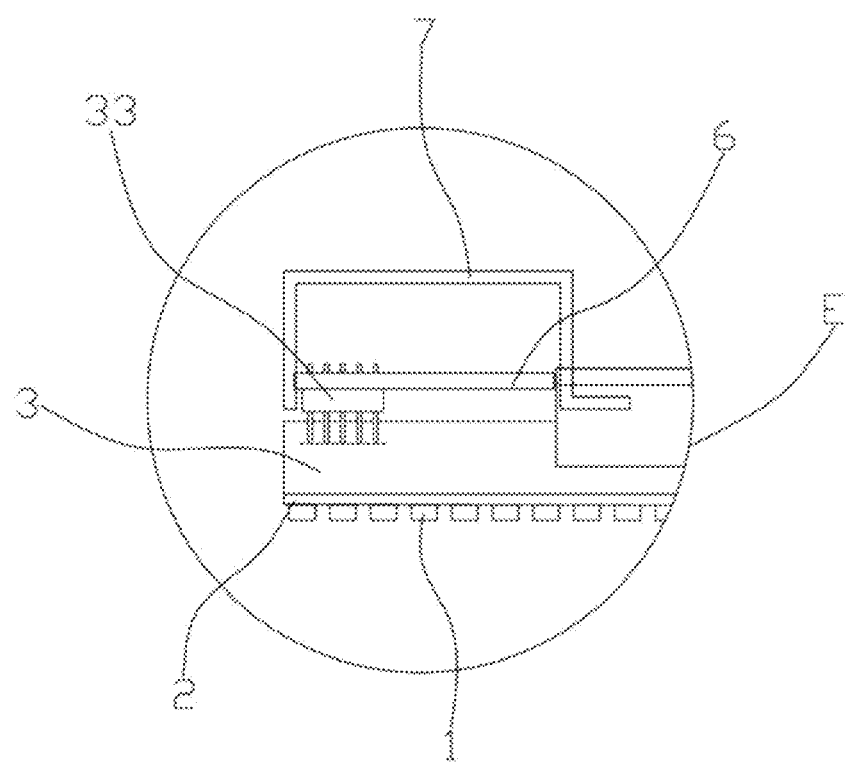
FIG. 10 is an enlarged schematic diagram of E part in FIG. 9.
Figure 11:
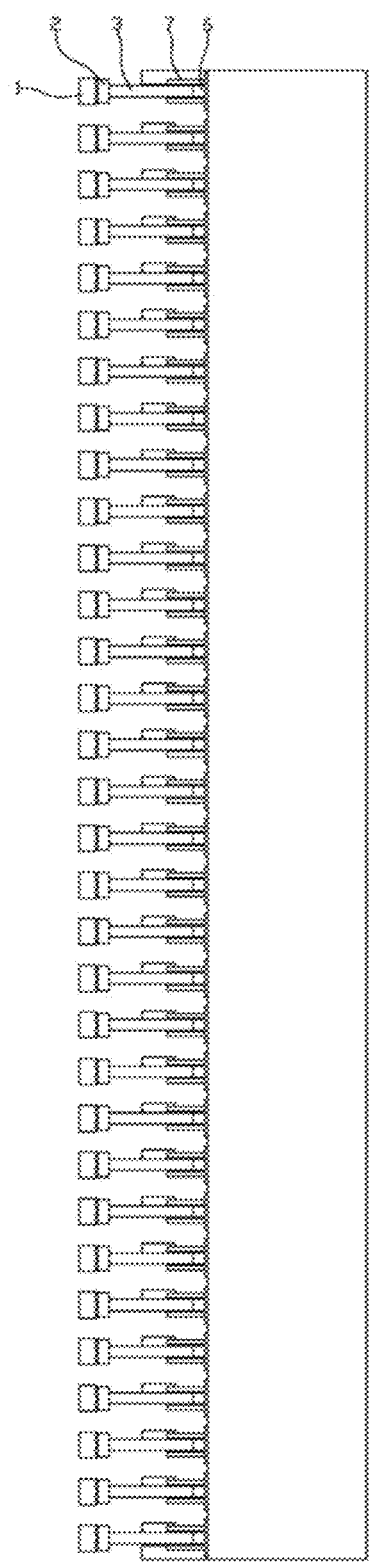
FIG. 11 is a left top view of an LED display module provided by an embodiment of the present invention.
Figure 12:
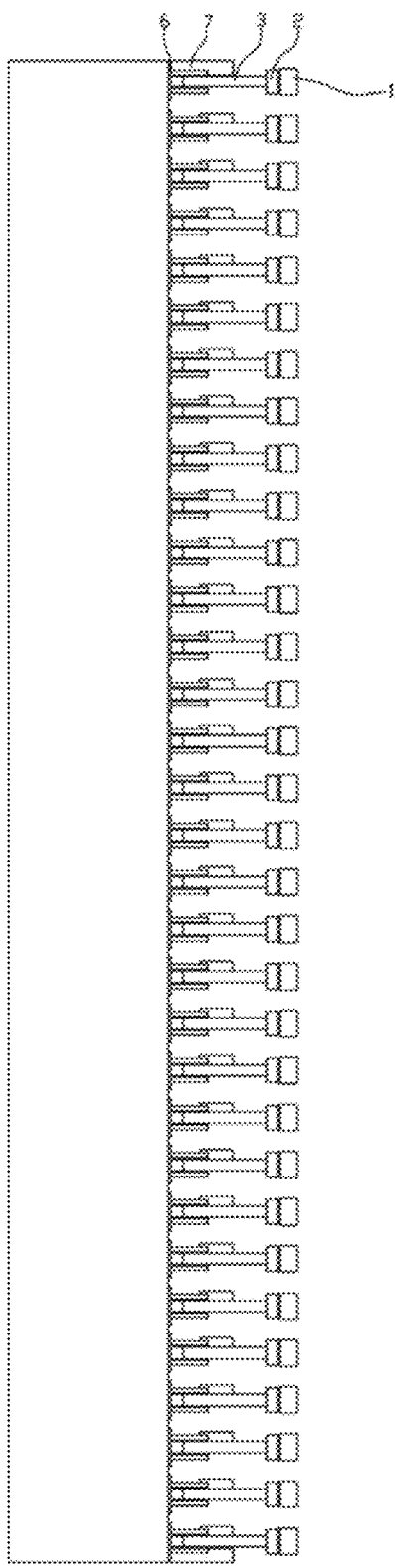
FIG. 12 is a right top view of an LED display module provided by an embodiment of the present invention.

The LED display module in the embodiment, as shown in FIG. 1, FIG. 2 and FIG. 3, comprises a plurality of lamp beads 1, linearly arranged lamp bead boards 2, linearly arranged driving PCBs 3, a frame 4, a transparent glass board 5, connecting boards 6 and a fixing piece 7. The plurality of lamp beads 1 are fixed to board surfaces of the lamp bead boards 2 and are electrically connected with the lamp bead boards 2. The lamp bead boards 2 are fixed to the driving PCBs 3 and are electrically connected with the driving PCBs 3. The board surfaces of the lamp bead boards 2 are perpendicular to the board surfaces of the driving PCBs 3. The driving PCBs 3 are arranged in the frame 4. The frame 4 is fixed to the glass board 5. The driving PCBs 3 are fixed to the connecting boards 6. The board surfaces of the driving PCBs 3 are perpendicular to the board surface of the glass board 5. The fixing piece 7 is fixed to the frame 4. the frame 4 comprises a first sub-frame 41 positioned on the top of the driving PCBs 3, and a second sub-frame 42 positioned on the bottom of the driving PCBs 3. The first sub-frame 41 and the second sub-frame 42 are L-shaped. The first sub-frame 41 comprises a first surface 411 and a second surface 412. The first surface 411 is arranged on the top of the driving PCBs 3, and the second surface 412 is arranged on the board surfaces of the driving PCBs 3. The second sub-frame 42 comprises a third surface 421 and a fourth surface 422. The third surface 421 is arranged on the bottom of the driving PCBs 3, and the fourth surface 422 is arranged on the board surfaces of the driving PCBs 3.

A preparation method is as follows:

(1) automatically pasting 3528 lamp beads on the board surfaces of the lamp bead boards, wherein the thickness of the lamp bead boards is 1.0 mm, and the length of the lamp bead boards is 320 mm;

(2) automatically pasting a driving IC encapsulated by a QFN technology on the driving PCB, wherein the thickness of the driving PCBs is 1.0 mm, and the length of the driving PCBs is 320 mm;

(3) flatly fixing the lamp bead boards in a special pallet with every 8 lamp bead boards as a group; and after coating tin glue on back surfaces of 8 lamp bead boards, vertically placing 8 driving PCBs into a pallet positioning frame and fixedly putting into an automatic reflow soldering device through a pallet fixture for processing with a furnace;

(4) welding pin headers of the lamp bead boards on the driving PCBs through pallet fixation by adopting a semi-automatic spot welder device;

(5) connecting and welding the welded lamp bead boards and the driving PCBs left and right through a fixture to realize left or right lamp bar driving PCBs with a length of 640 mm;

(6) fixedly welding connection pin headers of the 32 left or right lamp bar driving PCBs by adopting a semi-automatic spot welder device, and arranging one connecting board respectively on left and right to complete an old test of a left and a right module PCBA semi-finished products, wherein the thickness of the connecting boards is 2 mm. and the height of the connecting boards is 160 mm.

(7) assembling the glass board and the frame to complete a pallet rack;

(8) assembling the left and the right module PCBA semi-finished products into the pallet rack to complete a double-rod structural module; and (9) fixing the fixing piece to the frame to obtain the LED display module.

In the embodiment of the present invention, the lamp bead boards arranged at the positive end, facing audiences, of the board surfaces of the driving PCBs, and the driving PCBs adopt a T-shaped connection mode technology. Through combination of the left and the right module PCBA semi-finished products, the effects of infinite extension splicing with width of 1280 mm and height of 160 mm, calculation of the density of 40000 display pixel points per square and 48% of transparency under high density may be achieved.

Embodiment 2

The LED display module in the embodiment, as shown in FIG. 1, FIG. 2 and FIG. 3, comprises lamp beads 1, linearly arranged lamp bead boards 2, linearly arranged driving PCBs 3, a frame 4, a transparent glass board 5, connecting boards 6 and a fixing piece 7. The lamp beads 1 are fixed to board surfaces of the lamp bead boards 2 and are electrically connected with the lamp bead boards 2. The lamp bead boards 2 are fixed to the driving PCBs 3 and are electrically connected with the driving PCBs 3. The board surfaces of the lamp bead boards 2 are perpendicular to the board surfaces of the driving PCBs 3. The driving PCBs 3 are arranged in the frame 4. The frame 4 is fixed to the glass board 5. The driving PCBs 3 are fixed to the connecting boards 6. The board surfaces of the driving PCBs 3 are perpendicular to the board surface of the glass board 5. The fixing piece 7 is fixed to the frame 4. the frame 4 comprises a first sub-frame 41 positioned on the top of the driving PCBs 3, and a second sub-frame 42 positioned on the bottom of the driving PCBs 3. The first sub-frame 41 and the second sub-frame 42 are L-shaped. The first sub-frame 41 comprises a first surface 411 and a second surface 412. The first surface 411 is arranged on the top of the driving PCBs 3, and the second surface 412 is arranged on the board surfaces of the driving PCBs 3. The second sub-frame 42 comprises a third surface 421 and a fourth surface 422. The third surface 421 is arranged on the bottom of the driving PCBs 3, and the fourth surface 422 is arranged on the board surfaces of the driving PCBs 3.

A preparation method is as follows:

(1) automatically pasting 3528 lamp beads on the board surfaces of the lamp bead boards, wherein the thickness of the lamp bead boards is 1.0 mm, and the length of the lamp bead boards is 256 mm;

(2) automatically pasting a driving IC encapsulated by a QFN technology on the driving PCB, wherein the thickness of the driving PCBs is 1.0 mm, and the length of the driving PCBs is 256 mm;

(3) flatly fixing the lamp bead boards in a special pallet with every 8 lamp bead boards as a group; and after coating tin glue on back surfaces of 8 lamp bead boards, vertically placing 8 driving PCBs into a pallet positioning frame and fixedly putting into an automatic reflow soldering device through a pallet fixture for processing with a furnace;

(4) welding pin headers of the lamp bead boards on the driving PCBs through pallet fixation by adopting a semi-automatic spot welder device;

(5) connecting and welding the welded lamp bead boards and the driving PCBs left and right through a fixture to realize left or right lamp bar driving PCBs with a length of 512 mm;

(6) fixedly welding connection pin headers of the 32 left or right lamp bar driving PCBs by adopting a semi-automatic spot welder device, and arranging one connecting board respectively on left and right to complete an old test of a left and a right module PCBA semi-finished products, wherein the thickness of the connecting boards is 2 mm, and the height of the connecting boards is 160 mm.

(7) assembling the glass board and the frame to complete a pallet rack;

(8) assembling the left and the right module PCBA semi-finished products into the pallet rack to complete a double-rod structural module; and (9) fixing the fixing piece to the frame to obtain the LED display module.

In the embodiment of the present invention, the lamp bead boards arranged at the positive end, facing audiences, of the board surfaces of the driving PCBs, and the driving PCBs adopt a T-shaped connection mode technology. Through combination of the left and the right module PCBA semi-finished products, the effects of infinite extension splicing with width of 1024 mm and height of 256 mm, calculation of the density of 15625 display pixel points per square and 67.5% of transparency under high density may be achieved.

The above embodiments are preferred embodiments of the present invention, but not a limitation to structures and styles of products of the present invention. It should be noted that those skilled in the art can make several equivalent variations and modifications without departing from structural principles of the present invention, and the equivalent variations and modifications all belong to the protection scope of the present invention.

I claim:

1. An LED display module, comprising a plurality of lamp beads, linearly arranged lamp bead boards, linearly arranged driving PCBs, a frame, a transparent glass board, connecting boards and a fixing piece, wherein the plurality of lamp beads are fixed to board surfaces of the lamp bead boards; the lamp bead boards are fixed to the driving PCBs; the board surfaces of the lamp bead boards are perpendicular to the board surfaces of the driving PCBs; the driving PCBs are fixed to the connecting boards; each connecting board comprises a first sub-connecting board and a second sub-connecting board arranged on both ends of one side of the driving PCBs; the frame is fixed to the glass board; the board surfaces of the driving PCBs are perpendicular to the board surface of the glass board; the fixing piece is fixed to the frame; the frame comprises a first sub-frame positioned on the top of the driving PCBs, and a second sub-frame positioned on the bottom of the driving PCBs; the first sub-frame and the second sub-frame are L-shaped; the first sub-frame comprises a first surface and a second surface; the first surface is arranged on the top of the driving PCBs, and the second surface is arranged on the board surfaces of the driving PCBs; the second sub-frame comprises a third surface and a fourth surface; and the third surface is arranged on the bottom of the driving PCBs, and the fourth surface is arranged on the board surfaces of the driving PCBs.

2. The LED display module according to claim 1, wherein the plurality of lamp beads are arranged on the board surfaces of the lamp bead boards at an equal distance.

3. The LED display module according to claim 2, wherein an axial direction of a light emitting plane of the lamp beads is perpendicular to a plane direction of the glass board.

4. The LED display module according to claim 1, wherein a plurality of spacedly arranged light transmission holes are respectively formed on the second surface and the third surface.

5. The LED display module according to claim 1, wherein connecting needle seats are respectively arranged on both ends of the driving PCBs; the driving PCBs are fixedly connected with the first sub-connecting board and the second sub-connecting board through the connecting needle seats; and the board surfaces of the driving PCBs are perpendicular to the board surface of the first sub-connecting board and the board surface of the second sub-connecting board.

6. A preparation method of the LED display module of claim 1, comprising the following steps: (1) automatically pasting a plurality of lamp beads on the board surfaces of the lamp bead boards; (2) automatically pasting a driving IC encapsulated by a QFN technology on the driving PCBs; (3) flatly fixing the lamp bead boards in a special pallet with every 8 lamp bead boards as a group; and after coating tin glue on back surfaces of 8 lamp bead boards, vertically placing 8 driving PCBs into a pallet positioning frame and fixedly putting into an automatic reflow soldering device through a pallet fixture for processing with a furnace; (4) welding pin headers of the lamp bead boards on the driving PCBs through pallet fixation by adopting a semi-automatic spot welder device; (5) connecting and welding the welded lamp bead boards and the driving PCBs left and right through a fixture to realize 32 left or right lamp bar driving PCBs; (6) fixedly welding connection pin headers of the 32 left or right lamp bar driving PCBs by adopting a semi-automatic spot welder device, and arranging one connecting board respectively on left and right to complete an old test of a left and a right module PCBA semi-finished products; (7) assembling the transparent glass board and the frame to complete a pallet rack; (8) assembling the left and the right module PCBA semi-finished products into the pallet rack to complete a double-rod structural module; and (9) fixing the fixing piece to the frame to obtain the LED display module.

7. The preparation method of the LED display module according to claim 6, wherein the thickness of the lamp bead boards and the driving PCBs is 0.5-1.5 mm, and the length of the lamp bead boards and the driving PCBs is 315-325 mm.

8. The preparation method of the LED display module according to claim 6, wherein the thickness of the connecting boards is 1.5-2.5 mm, and the height of the connecting boards is 155-165 mm.

9. The preparation method of the LED display module according to claim 6, wherein the fixing piece and the frame are made of aluminum alloy, and the lamp bead boards, the driving PCBs and the connecting boards are made of glass fibers.

10. The preparation method of the LED display module according to claim 6, wherein the glass board is a high-transparency homogeneous substrate made of PMMA polymer material.

* * * * *